United States Patent [19]
Ecker et al.

[11] Patent Number: 5,992,957
[45] Date of Patent: Nov. 30, 1999

[54] ABRASION CONTROL ON SLIDING ASSEMBLIES

[75] Inventors: Richard M. Ecker, Poughkeepsie; Franz Edlinger, Margaretville; Peter W. Kelly, Stone Ridge, all of N.Y.

[73] Assignee: International Business Machines Corporation, Armonk, N.Y.

[21] Appl. No.: 09/063,989

[22] Filed: Apr. 21, 1998

[51] Int. Cl.$^6$ ..................................................... A47B 88/00
[52] U.S. Cl. ................................ 312/344.16; 312/344.36
[58] Field of Search ........................ 312/334.16, 334.36, 312/332.1

[56] References Cited

U.S. PATENT DOCUMENTS

| | | | |
|---|---|---|---|
| 1,751,899 | 3/1930 | Whitfield | 312/334.36 X |
| 2,606,091 | 8/1952 | Buchy et al. | 312/334.16 |
| 2,815,252 | 12/1957 | Baker | 312/334.36 X |
| 2,944,865 | 7/1960 | Hammesfahr | 312/334.16 |
| 4,138,176 | 2/1979 | Cowdroy | 312/334.16 |
| 5,626,405 | 5/1997 | Banks | 312/334.16 X |

FOREIGN PATENT DOCUMENTS 1193165  10/1959  France ............................... 312/334.16

OTHER PUBLICATIONS

"Foam–Filled Cushions for Sliding Trays"; NASA Tech Briefs, vol. 5, No. 1, Spring 1980.

*Primary Examiner*—Peter M. Cuomo
*Assistant Examiner*—David E. Allred
*Attorney, Agent, or Firm*—Floyd A. Gonzalez

[57] ABSTRACT

An abrasion control apparatus allowing a drawer member of an electronic enclosure to be inserted into a receptacle wherein the contacting sides of the drawer member and receptacle are made of aluminized steel. The invention includes a double thick side of the receptacle; the side of the receptacle which comes in contact with the side of the drawer member having a window in which is placed a plastic wear strip. The abrasion control apparatus further includes wear strips in a notched portion of the side of the receptacle and a bottom of the receptacle such that contact is prevented between the drawer and the metal sides of the receptacle as the drawer member is inserted into the receptacle.

11 Claims, 2 Drawing Sheets

ABRASION CONTROL ON SLIDING ASSEMBLIES

The present invention is related to providing abrasion control on sliding assemblies and is more particularly related to providing low friction plastic strips between metal sliding assemblies to prevent contact between the metal assemblies as one slides over the other.

BACKGROUND OF THE INVENTION

In many cases it is desirable to make enclosures for electronic equipment of aluminized steel, which is cold rolled sheet steel with a thin aluminum coating. Aluminized steel is an inexpensive material that has a very good conductive surface, provides good electromagnetic compatibility containment, and has good corrosion resistance. However, the surface of aluminized steel is very soft and is prone to scraping and abrading if the two surfaces are allowed to contact and slide over one another. If the surfaces abrade one another, small particles of aluminum and steel in the form of highly conductive debris would be introduced into the electronics of the enclosure, contaminating the electronics contained within and possibly causing electrical shorts and failures of the electronics.

SUMMARY OF THE INVENTION

The present invention provides for an abrasion control apparatus which allows a drawer member of an electronic enclosure to be inserted into a receptacle wherein the contacting sides of the drawer member and receptacle are made of aluminized steel. The invention includes a double thick side of the receptacle in which the side of the receptacle which comes in contact with the side of the drawer member has a window in which is placed a plastic wear strip. The abrasion control apparatus further includes wear strips in a notched portion of the side of the receptacle and a bottom of the receptacle such that contact is prevented between the drawer and the metal sides of the receptacle as the drawer member is inserted into the receptacle.

The foregoing and other objects, features and advantages of the invention will be apparent from the following more particular description of the preferred embodiment of the invention as illustrated in the drawings.

DESCRIPTION OF THE PREFERRED EMBODIMENT

Figure 1:
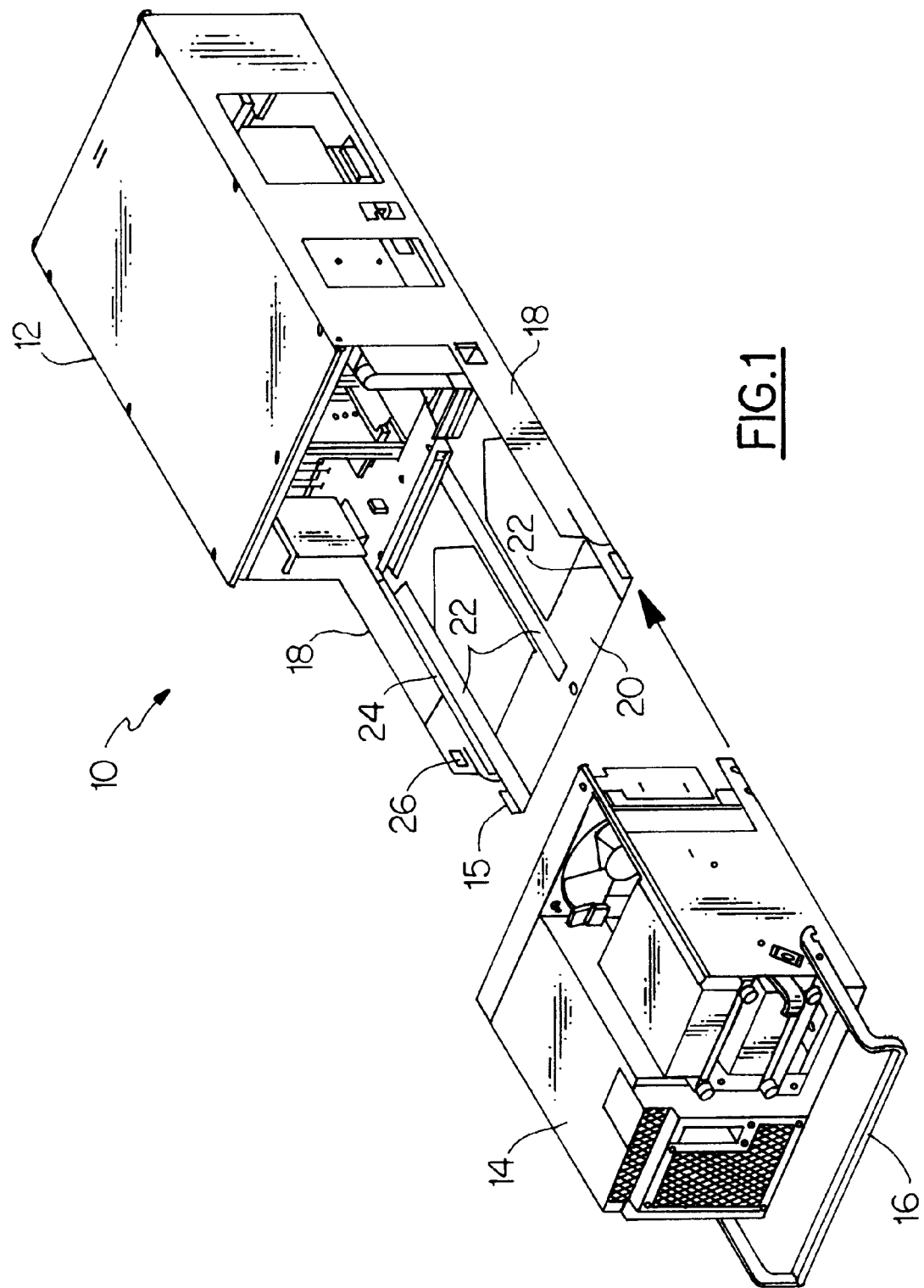
FIG. 1 is a perspective view of an enclosure for electronics which includes the present invention, the enclosure including a receptacle assembly and a drawer assembly to be inserted into said receptacle assembly.

FIG. 1 is a perspective view of an enclosure assembly 10 for electronics which may be used in a rack mounted computer system. The enclosure 10 includes a metal receptacle assembly 12 for receiving a metal drawer assembly 14 arranged such that the drawer assembly or member 14 is placed on a forward-extended portion 15 of the receptacle assembly 12 and inserted into the receptacle assembly 12 until it is fully seated by the action of the engaging handle 26. The action of the engaging handle 16 is not part of the present invention, and will not be discussed further herein.

In one embodiment, the present invention is incorporated in a computer having a modular enclosure assembled in accordance with U.S. patent application Ser. No. 09/063,990 to Ayd et al. for MODULAR NODE ASSEMBLY FOR RACK MOUNTED MULTIPROCESSOR COMPUTER (Attorney Docket No. (PO9-97-160); the chassis of enclosure are joined in accordance with U.S. patent application Ser. No. 09/063,836 to Ayd et al. for CAMMING MECHANISM FOR JOINING MODULAR ELECTRONIC ENCLOSURES (Attorney Docket No. PO9-97-174); cooling air is distributed in the enclosure in accordance with U.S. patent application Ser. No. 09/063,850 to Delia et al. for CONSTANT IMPEDANCE AIR BAFFLE FOR COOLING OF ELECTRONIC CARD ASSEMBLIES (Attorney Docket No. PO9-97-161); and the tailgate of the computer is constructed in accordance with U.S. patent application Ser. No. 09/063,991 to Ecker el al. for EXPANSION SLOT ALIGNMENT PINS (Attorney Docket No. PO9-98-076), all of which are owned by the assignee of the present invention and incorporated herein by reference.

The wall members of the receptacle assemble 12 and drawer assembly 14 are made of aluminized steel, which is cold rolled sheet steel with a thin aluminum coating. Aluminized steel is an inexpensive material that has a very good conductive surface, provides good electro-magnetic compatibility containment and has good corrosion protection. However, the surface of aluminized steel is very soft and is prone to scraping and abrading if the two surfaces are allowed to contact and slide over one another. If the surfaces abrade one another, small particles of aluminum and steel in the form of highly conductive debris would be introduced into the electronics of the enclosure, contaminating the electronics contained within the enclosure and possibly causing electrical shorts and failures of the electronics, resulting in processing errors.

Returning to FIG. 1, the forward extending portion 15 of the receptacle assembly 12 includes side members 18 and a bottom member 20. The bottom member 20 has three strips of plastic tape 22 for providing wear strips on which the bottom of the drawer assembly can ride as it is being slidably inserted into the receptacle assembly 12. The plastic tape 22 may be strips of Teflon tape available from Allied Signal Corporation, Morris Town, N.J. The sides of the bottom member 20 may be bent at right angles to form the side members 18 of the forward extension 15, and sized to receive the drawer member 14. It will be understood that the portion of the bottom member 20 which is next to the side members 18 and covered by the plastic wear strips 22 form bottom rails for supporting the drawer member as it is slid into place.

Each of the side members 18 also includes a wear strip 24 similar to the plastic tape 22, and further includes a plastic strip 26 embedded into the side wall 30 of each of the side members 18. This construction is more clearly shown in FIG. 2. The wear strip 24 includes a piece 25 which covers the most forward part of the side member 27. The plastic strip 26 may be made of an Acrylic/PVC alloy sheet such as Kydex 100 from Kleerdex Company, Bloomsburg, Pa., bonded to the metal with a suitable adhesive 42 (see FIG. 3) such as 3M Corporation's 468 MP high performance adhesive. The leading edge 32 of the plastic strip 26 is chamfered to lessen the impact of the contact between the strip 26 and the edge 44 of the chassis wall 36 of the drawer member 14 as it is being inserted into the receptacle assembly 12 (see FIG. 3). A portion 30 of the side member 18 is double thickness, as may be provided by folding over the side wall, or by spot welding a second piece of aluminized steel on the side member 18.

Figure 2:
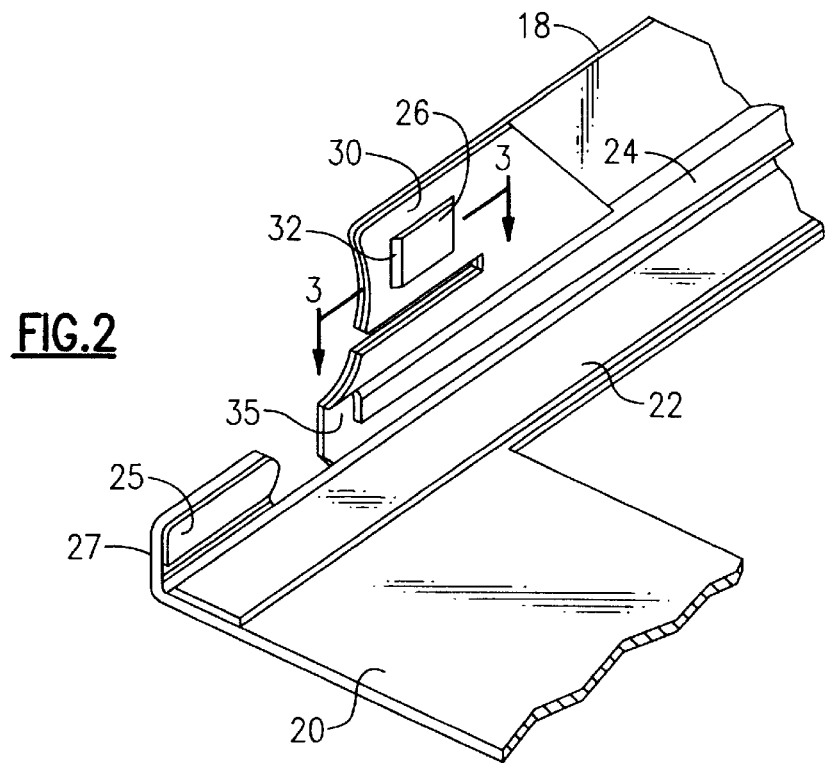
FIG. 2 is a partial view of a section of the side members of the receptacle assembly of the enclosure of FIG. 1.
Figure 3:
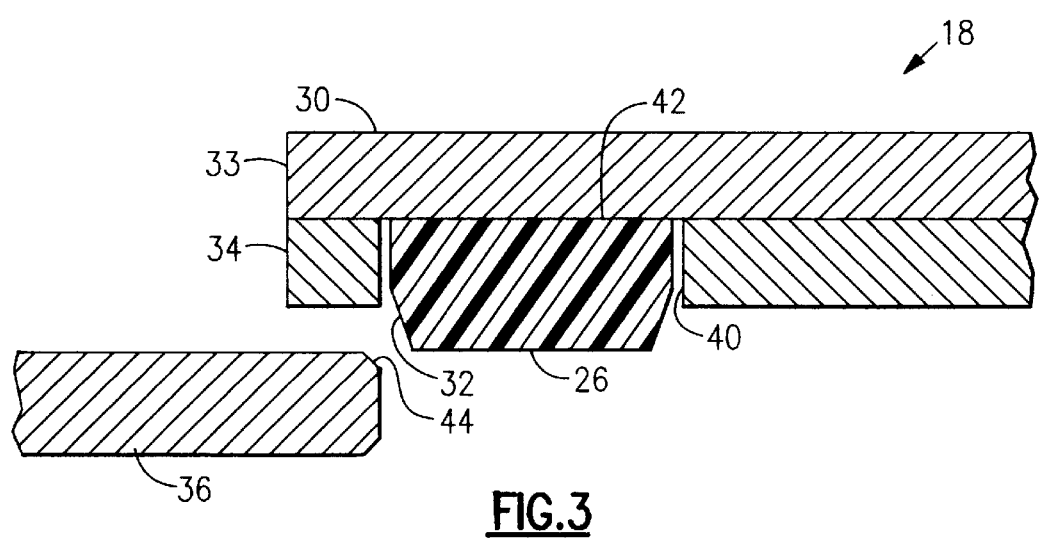
FIG. 3 is a sectional view taken along section lines 3—3 of FIG. 2 and showing a portion of the side member of the receptacle assembly of the enclosure having a double wall, a window in one of the wall portions, and a plastic glide strip in the window for slidable engagement with a side wall of the drawer assembly FIG. 1.

FIG. 3 is a section of the side member 18 taken along section line 3—3 of the FIG. 2. The double walled portion 30 of the side member 18 has an outside wall 33 and an inside wall 34. The inside wall 34 is that part of the side member 18 which faces the side wall 36 of the chassis of the drawer member 14 when it is placed into the receptacle assembly 12 of the enclosure 10. The inside wall 34 has a window 40 for receiving the plastic strip 26. The back of the plastic strip 26 has an appropriate adhesive 42, as previously described, for fastening the plastic strip 26 to the exposed inner surface of the outside wall 33. The plastic strip 26 has a greater thickness than the thickness of the inside wall 34 such that the side of the drawer member 14 will come into slidable contact with the strip 26 and not the wall 34.

Returning to FIG. 2, the inside wall 34 does not extend below the plastic wear strip 24, thus forming a notch 35 in which the strip 24 fits. The thickness of the strip 24 is also greater than the thickness of the inside wall 34. As previously mentioned, the leading edge 32 of the plastic strip 26 is chamfered to a point below the surface of the inside wall 34 (see FIG. 3). The leading edge 44 of the side wall 36 of the drawer member 14 may be rounded to reduce the impact or cutting effect when the leading edge 44 first comes into contact with the edge 32 of the plastic strip 26. The advantage of the plastic strip 26 being in the wall 30 is that the inside wall 34 protects the interface between the plastic strip 26 and the outside wall 33 as the side wall 36 of the drawer member 14 is being inserted into and sliding past the forward extension portion 25 of the receptacle 12.

It will thus be understood that all wear surfaces between the receptacle assembly 12 and the drawer member 14 are protected by plastic wear strips. It will also be understood that the plastic wear strips 26, which are on the inside of the side members 18 of the receptacle assembly 12 and provide slidable engagement with the leading edge of the drawer assembly 14 as it is received by the receptacle assembly 12, are protected in windows in the inside walls 34 of the side members 18 such that the edge of the plastic strips 26 will not be lifted up and scraped off during the insertion operation.

While we have illustrated and described the preferred embodiment of our invention, it is to be understood that we do not limit ourselves to the precise construction herein disclosed, and the right is reserved to all changes and modifications coming within the scope of the invention as defined in the appended claims.

Having thus described our invention, what we claim as new, and desire to secure by Letters Patent is:

1. An abrasion control apparatus for use in electronic enclosures, said abrasion control apparatus comprising:
   a metal receptacle for receiving a metal drawer member;
   a side member unitarily formed as a structural part of said metal receptacle, said side member forming a guide for said metal drawer member when said metal drawer is received by said metal receptacle;
   a side piece attached to said side member between said side member and said metal drawer member when said metal drawer member is received in said metal receptacle, said side member and said side piece forming a double side wall portion, said side piece having a window therein exposing a flat inner surface of said side member therethrough; and
   a plastic strip having one side adhesively attached to said exposed flat inner surface of said side member, said plastic strip extending through the window in said side piece such that a second side of said plastic strip slidably engages said metal drawer member and said side piece protects the attachment between said plastic strip and said exposed portion of said side member from contact with said metal drawer member when said metal drawer member is received in said metal receptacle, the thickness of said strip of plastic material being greater than the thickness of said side piece such that when the metal drawer member is in slidable engagement with said strip of plastic material it is not in engagement with said side piece.

2. The abrasion control apparatus of claim 1 wherein an edge of said plastic strip which first contacts the metal drawer piece as it is received in said metal receptacle is chamfered to a point recessed from an inner surface of said side piece.

3. The abrasion control apparatus of claim 1 further comprising:
   a bottom rail attached to one side and at a right angle to said side member forming a support for the metal drawer member when it is received in said metal receptacle; and
   at least one strip of plastic tape material on said bottom rail between said bottom rail and the supported metal drawer member for slidable engagement with said metal drawer member as it is received by said metal receptacle.

4. The abrasion control apparatus of claim 3 wherein said side member is an extension of and bent at a right angle to said bottom rail.

5. The abrasion control apparatus of claim 3 wherein said side piece forms a notch between an edge thereof closest to said bottom rail and bottom rail, and further comprising:
   a second strip of plastic material attached to said side member and extending into said notch such that a portion of said side piece at one end of said notch prevents contact between the metal drawer member and the connection of said second strip of plastic material and said side member as the metal drawer member is received in said metal receptacle, the thickness of said second strip being greater than the thickness of said side piece such that when the metal drawer is in slidable engagement with said second strip of plastic material, it is not in engagement with said side piece.

6. The abrasion control apparatus of claim 5 wherein the edge of said second plastic strip which first contacts the metal drawer member as it is received in said metal receptacle is chamfered to a point recessed relative to an inner surface of said side piece.

7. The abrasion control apparatus of claim 1 wherein said plastic strip is a wear strip made of an Acrylic/PVC alloy sheet.

8. The abrasion control apparatus of claim 5 wherein said second plastic strip is a Teflon wear strip.

9. The abrasion control apparatus of claim 3 wherein said bottom rail is part of a bottom piece of said receptacle, said bottom piece having at least one additional plastic strip thereon for slidable engagement with said drawer member as it is inserted into said receptacle.

10. The abrasion control apparatus of claim 9 wherein said bottom piece extends from the bottom rail along one side of said receptacle to a second bottom rail along an opposite side of said receptacle, and further comprising said one additional strip of plastic tape material is a plastic strip in the center of said bottom piece slidably engaging said drawer member when it is inserted into said receptacle.

11. The abrasion control apparatus of claim 10 wherein the said side member and said bottom member of said metal receptacle are made of aluminized steel.

\* \* \* \* \*